(12) United States Patent
Kim et al.

(10) Patent No.: US 8,437,203 B2
(45) Date of Patent: May 7, 2013

(54) NONVOLATILE MEMORY APPARATUS AND METHOD FOR PROCESSING CONFIGURATION INFORMATION THEREOF

(75) Inventors: Kyoung Nam Kim, Icheon-si (KR); Beom Ju Shin, Icheon-si (KR)

(73) Assignee: SK Hynix Inc., Gyeonggi-do (KR)

( * ) Notice: Subject to any disclaimer, the term of this patent is extended or adjusted under 35 U.S.C. 154(b) by 254 days.

(21) Appl. No.: 12/983,138

(22) Filed: Dec. 31, 2010

(65) Prior Publication Data

US 2012/0002487 A1 Jan. 5, 2012

(30) Foreign Application Priority Data

Jul. 2, 2010 (KR) ........................ 10-2010-0063762

(51) Int. Cl.
*G11C 7/00* (2006.01)
*G11C 8/18* (2006.01)

(52) U.S. Cl.
USPC .................................. 365/189.2; 365/233.11

(58) Field of Classification Search ............... 365/189.2, 365/233.11, 185.09
See application file for complete search history.

(56) References Cited

U.S. PATENT DOCUMENTS

| 5,359,564 | A | 10/1994 | Liu et al. |
| 6,944,039 | B1 | 9/2005 | Nataraj et al. |
| 7,660,142 | B2 * | 2/2010 | Curatolo et al. ............... 365/104 |
| 2004/0004858 | A1 | 1/2004 | Kondo |
| 2005/0082579 | A1 | 4/2005 | Horii et al. |
| 2008/0239809 | A1 * | 10/2008 | Chae et al. ............... 365/185.09 |

FOREIGN PATENT DOCUMENTS

| JP | 1999-066885 | 3/1999 |
| JP | 2001-014863 | 1/2001 |
| KR | 1020090000363 A | 1/2009 |
| KR | 1020090004494 A | 1/2009 |

* cited by examiner

*Primary Examiner* — Hoai V Ho
*Assistant Examiner* — Tri Hoang
(74) *Attorney, Agent, or Firm* — William Park & Associates Patent Ltd.

(57) ABSTRACT

A nonvolatile memory apparatus includes a memory device having a configuration information storage block for storing a first configuration data group and a second configuration data group having fewer bits than the first configuration data group and a configuration information processing circuit configured to determine a majority of the first configuration data group outputted from the memory device, during a first period of a power-up operation, and determine a majority of the second configuration data group outputted from the memory device, during a second period after the first period.

11 Claims, 3 Drawing Sheets

NONVOLATILE MEMORY APPARATUS AND METHOD FOR PROCESSING CONFIGURATION INFORMATION THEREOF

CROSS-REFERENCES TO RELATED APPLICATION

The present application claims priority under 35 U.S.C. §119(a) to Korean application number 10-2010-0063762, filed on Jul. 2, 2010, in the Korean Intellectual Property Office, which is incorporated herein by reference in its entirety.

BACKGROUND

1. Technical Field

The present invention relates to a nonvolatile memory apparatus, and more particularly, to a technology for processing a plurality of configuration data groups stored in a configuration information storage block.

2. Related Art

A flash memory apparatus as a kind of nonvolatile memory apparatus includes a configuration information storage block for storing a plurality of configuration data groups. The configuration information storage block is assigned to a specified block of a memory device and is composed of a plurality of nonvolatile memory cells. For reference, such a configuration information storage block is called a code address memory (CAM).

Each of the plurality of configuration data groups, which are stored in the configuration information storage block, includes any one of internal bias information, internal logic configuration information, failed address information, and redundancy information. In a power-up operation period when power is first applied to a nonvolatile memory apparatus and power initialization is performed, the plurality of configuration data groups, which are stored in the configuration information storage block, are detected and outputted by a page buffer. At this time, a process for determining majorities of the plurality of configuration data groups outputted from the page buffer is performed, and determination results are stored as a plurality of configuration signals. "Majorities" or "majority" may be defined as having a majority of bits that are logical "1" in a group of bits. The group of bits may be, for example, 4 bits or 8 bits.

For reference, when each of the configuration data groups is programmed to the configuration information storage block, all the respective data of each configuration data group are programmed as the same value for increased reliability. For example, when assuming that one configuration data group is composed of 8-bit configuration data, eight '1's are programmed to the configuration information storage block by being copied. When the page buffer detects and outputs the configuration data group stored in the configuration information storage block, output data can be outputted with various values such as '1111 1111', '1111 1000', etc. depending upon a programmed state and detection capability. A final data value is detected by determining a majority of 8-bit data signals which are outputted. That is to say, '1' is determined as a final data value if the majority of 8-bit data signals has the value of '1.' Otherwise, '0' is determined as a final data value.

Configuration information processing may be performed in this way during the power-up operation period. In this regard, in the case where the number of the plurality of configuration data groups is substantial, a lengthy time for processing configuration information is required every time power is initialized. Thus, a technology for solving this problem is demanded in the art.

SUMMARY

In one embodiment of the present invention, a nonvolatile memory apparatus includes a memory device having a configuration information storage block for storing a first configuration data group and a second configuration data group having fewer bits than the first configuration data group, and a configuration information processing circuit configured to determine a majority of the first configuration data group outputted from the memory device during a first period of a power-up operation, and determine a majority of the second configuration data group outputted from the memory device during a second period after the first period.

In another embodiment of the present invention, a method for processing configuration information of a nonvolatile memory apparatus includes generating a configuration data group with a number of data bits when input data signals correspond to second configuration information, where the number of data bits is less than when the input data signals correspond to first configuration information, programming the configuration data group to a memory device, detecting to which of the first configuration information and the second configuration information the configuration data group outputted from the memory device corresponds, and determining a majority by controlling a determining bit number depending upon a detection result.

BRIEF DESCRIPTION OF THE DRAWINGS

Features, aspects, and embodiments are described in conjunction with the attached drawings, in which.

DETAILED DESCRIPTION

Hereinafter, various embodiments of a nonvolatile memory apparatus and a method for processing configuration information thereof according to the present invention will be described below with reference to the accompanying drawings through exemplary embodiments.

For reference, since terms, symbols and signs that are used in drawings and in this detailed description to designate devices, blocks, and so on may be used for detailed units as the occasion demands, it is to be noted that the same terms, symbols, and signs may not designate the same devices, blocks, and so on in an entire circuitry. In general, the logic signals of a circuit and binary data values are divided into a high level (H) and a low level (L) in correspondence to voltage levels and may be represented as '1' and '0'. Furthermore, as the occasion demands, a high impedance state (a high-Z state) may be defined and described. Meanwhile, the data value of a data signal can be represented differently in a single bit form or a multi-bit form depending upon a voltage level or a current magnitude.

Figure 1:
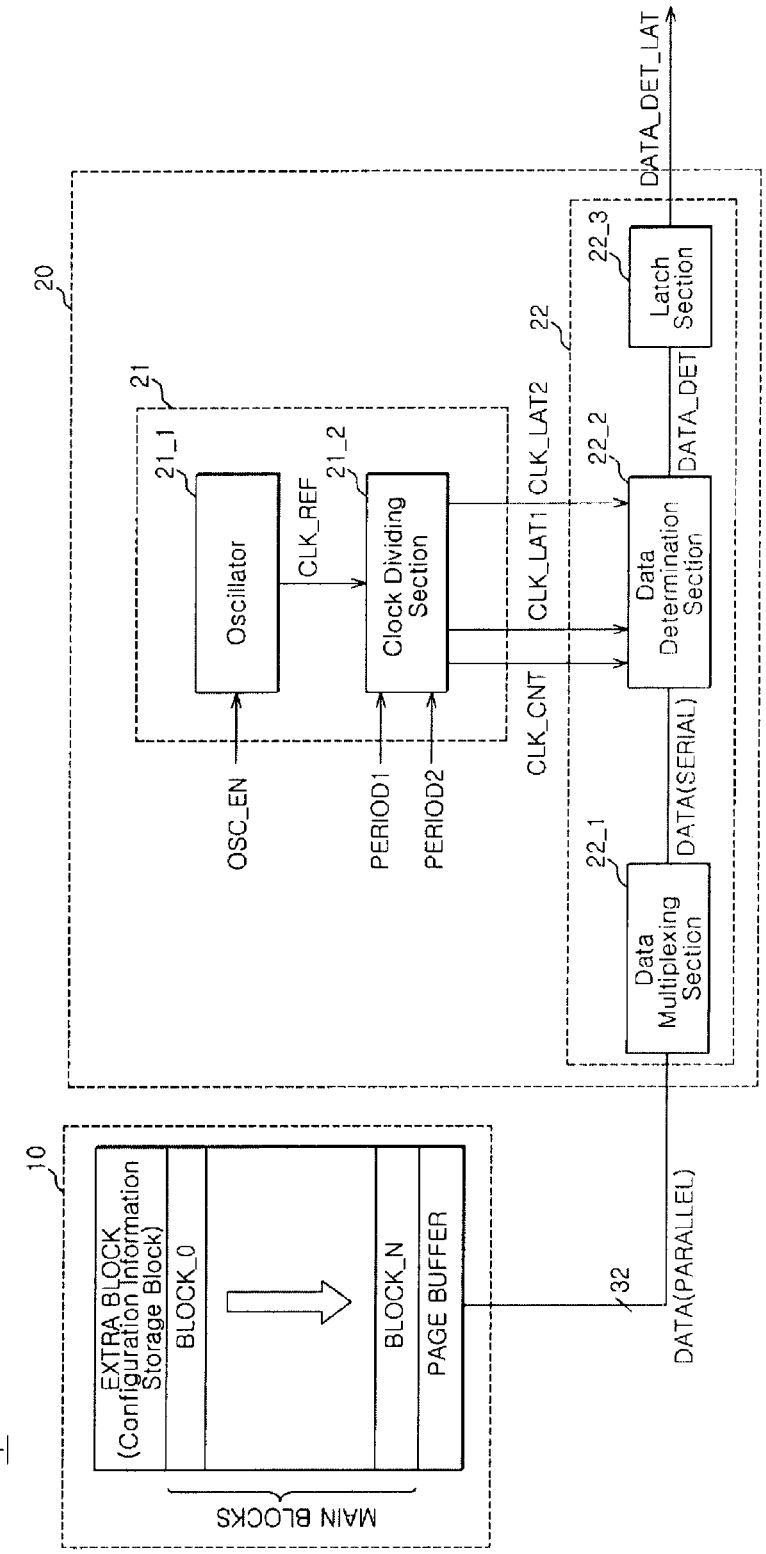
FIG. 1 is a configuration diagram of a nonvolatile memory apparatus in accordance with an embodiment of the present invention.

FIG. 1 is a configuration diagram of a nonvolatile memory apparatus in accordance with an embodiment of the present invention.

The nonvolatile memory apparatus 1 in accordance with the embodiment of the present invention includes only a simplified configuration for the sake of clear description.

Referring to FIG. 1, a nonvolatile memory apparatus 1 includes a memory device 10 and a configuration information processing circuit 20.

The detailed configuration and principal operations of the nonvolatile memory apparatus 1 configured as mentioned above will be described below.

The memory device 10 includes main storage blocks BLOCK_0 through BLOCK_N, an extra storage block EXTRA BLOCK, and a page buffer PAGE BUFFER. Each of the main storage blocks BLOCK_0 through BLOCK_N is divided into a plurality of pages, and each page is composed of a plurality of memory cells. The extra storage block EXTRA BLOCK includes a configuration information storage block for storing a plurality of configuration data groups. The configuration information storage block is divided into a plurality of pages, and each page is composed of a plurality of memory cells. The page buffer PAGE BUFFER detects and outputs data which are stored in the configuration information storage block and the main storage blocks BLOCK_0 through BLOCK_N. For reference, among the plurality of configuration data groups, a first configuration data group includes internal bias information and internal logic configuration information, and a second configuration data group includes failed address information and redundancy information.

The first configuration data group and the second configuration data group, which are stored in the configuration information storage block, are composed of data which have different bit numbers. That is to say, each of the configuration data groups is generated by copying data values of input data signals by a predetermined number of bits, and is programmed to the configuration information storage block. The second configuration data group, which is generated when input data signals correspond to second configuration information, that is, failed address information and redundancy information, has a fewer number of data bits than the first configuration data group, which is generated when input data signals correspond to first configuration information, that is, internal bias information and internal logic configuration information. In the present embodiment, the first configuration data group is defined as 8-bit data signals, and the second configuration data group is defined as 4-bit data signals.

When determining, in a power-up operation, respective majorities of the first and second configuration data groups which are sequentially outputted from the memory device 10, the configuration information processing circuit 20 determines the majorities by discriminating two periods.

First, a majority of the first configuration data group, which is outputted from the memory device 10 during a first period as an initial stage of the power-up operation, is determined.

Next, a majority of the second configuration data group, which is outputted from the memory device 10 during a second period after the first period, is determined.

In other words, during the first period as the initial stage of the power-up operation, since power is not stabilized, the majority of the first configuration data group which is composed of a greater number of bits is determined. During the second period in which power is relatively stabilized, the majority of the second configuration data group which is composed of a fewer number of bits is determined. Accordingly, a time required for determining majorities can be shortened while ensuring operational stability.

In the present embodiment, the configuration information processing circuit 20 includes a control clock output unit 21 and a configuration data processing unit 22.

The control clock output unit 21 outputs a counting clock signal CLK_CNT, and a first latching clock signal CLK_LAT1 and a second latching clock signal CLK_LAT2 which have cycles longer by respective predetermined numbers of times than the counting clock signal CLK_CNT. In detail, the control clock output unit 21 outputs the counting clock signal CLK_CNT and the first latching clock signal CLK_LAT1 when a first period signal PERIOD1 is activated, or activated, and outputs the counting clock signal CLK_CNT and the second latching clock signal CLK_LAT2 when a second period signal PERIOD2 is activated. The second latching clock signal CLK_LAT2 has a cycle shorter by a predetermined number of times than the first latching clock signal CLK_LAT1.

In the present embodiment, the control clock output unit 21 includes an oscillator 21_1, and a clock dividing section 21_2. The oscillator 21_1 generates a reference clock signal CLK_REF in response to a clock enable signal OSC_EN. The clock dividing section 21_2 divides the reference clock signal CLK_REF, and thereby generates the counting clock signal CLK_CNT, the first latching clock signal CLK_LAT1, and the second latching clock signal CLK_LAT2. The clock dividing section 21_2 outputs the first latching clock signal CLK_LAT1 and the second latching clock signal CLK_LAT2 in response to the first period signal PERIOD1 and the second period signal PERIOD2, respectively. For reference, the first period signal PERIOD1 is a signal which is activated during the first period, and the second period signal PERIOD2 is a signal which is activated during the second period. The first and second period signals PERIOD1 and PERIOD2 can be defined as signals which are outputted from an internal command processing circuit, or the like.

The configuration data processing unit 22 determines the respective majorities of the first and second configuration data groups which are sequentially outputted from the memory device 10, under the control of the counting clock signal CLK_CNT and corresponding latching clock signals which are outputted from the control clock output unit 21, and outputs determination results as a plurality of configuration signals DATA_DET_LAT. The configuration data processing unit 22 determines the majority of the first configuration data group under the control of the counting clock signal CLK_CNT and the first latching clock signal CLK_LAT1. Further, the configuration data processing unit 22 determines the majority of the second configuration data group under the control of the counting clock signal CLK_CNT and the second latching clock signal CLK_LAT2.

In the present embodiment, the configuration data processing unit 22 includes a data multiplexing section $22\_{}_1$, a data determination section $22\_{}_2$, and a latch section $22\_{}_3$. The data multiplexing section $22\_{}_1$ performs a function of parallel-to-serial conversion of the configuration data groups. For example, the data multiplexing section 22_1 convers parallel data of the configuration data group DATA(PARALLEL) into serial data DATA(SERIAL). The data determination section $22\_{}_2$ determines the majority of signals which are outputted from the data multiplexing section $22\_{}_1$, under the control of the counting clock signal CLK_CNT and a corresponding latching clock signal, and outputs a determination result. The latch section $22\_{}_3$ latches signals which are outputted from the data determination section $22\_{}_2$.

Figure 2:
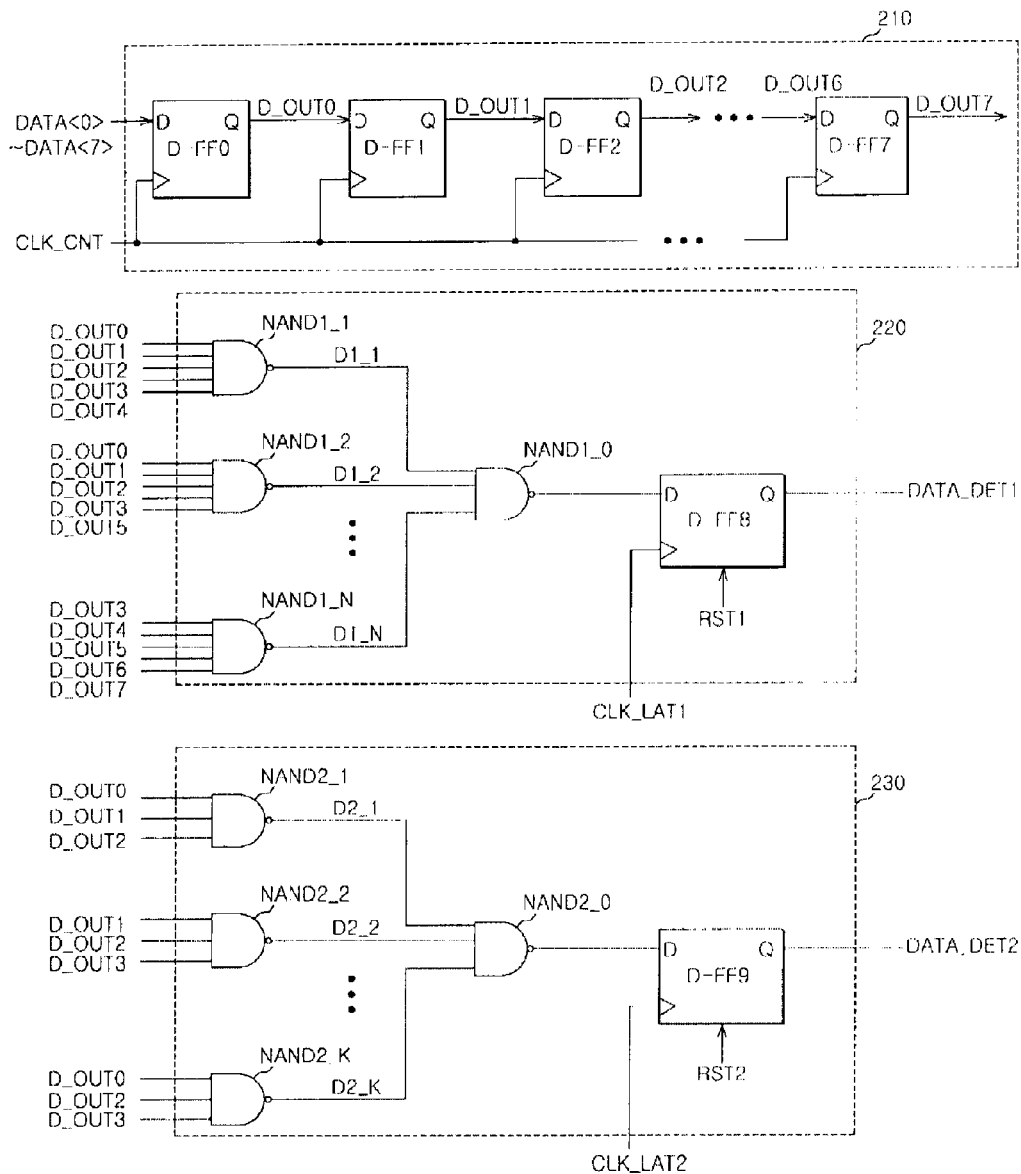
FIG. 2 is a circuit diagram illustrating an embodiment of a data determination section shown in FIG. 1.

FIG. 2 is a circuit diagram illustrating an embodiment of the data determination section 22_2 shown in FIG. 1.

Referring to FIG. 2, the data determination section $22\_{}_2$ includes a plurality of D flip-flops D-FF0 through D-FF7, 210, a first data combining part 220, and a second data combining part 230.

The plurality of D flip-flops D-FF0 through D-FF7 latch a plurality of data signals DATA<0> through DATA<7> which are sequentially applied, under the control of the counting clock signal CLK_CNT, and output D_OUT0 through D_OUT7, respectively. The first data combining part 220 logically combines the plurality of data signals DATA<0> through DATA<7> which are stored in the plurality of D flip-flops D-FF0 through D-FF7, detects a majority of logical ones, and outputs a detected signal DATA_DET1 under the control of the first latching control signal CLK_LAT1. The second data combining part 230 logically combines the plurality of data signals DATA<0> through DATA<7> which are stored in the plurality of D flip-flops D-FF0 through D-FF7, detects a majority of logical ones, and outputs a detected signal DATA_DET2 under the control of the second latching control signal CLK_LAT2.

The first data combining part 220 is composed of a plurality of NAND gates NAND1_0 through NAND1_N and a D flip-flop D-FF8. In the present embodiment, if 5 or more-bit data among the 8-bit data are detected as '1', a final output signal DATA_DET1 is outputted as '1'. That is to say, the 8-bit data signals D_OUT0 through D_OUT7 are NANDed 5-bits at a time by NAND gates NAND1_1 through NAND1_N, and NANDing results D1_1 through D1_N are NANDed again by NAND gate NAND1_0, by which a value of the final output signal DATA_DET1 is determined.

The second data combining part 230 is composed of a plurality of NAND gates NAND2_0 through NAND2_K and a D flip-flop D-FF9. In the present embodiment, if 3 or more-bit data among the 4-bit data are detected as '1', a final output signal DATA_DET2 is outputted as T. That is to say, the 4-bit data signals D_OUT0 through D_OUT3 are NANDed 3-bits at a time by 3-bits NAND gates NAND2_1 through NAND2_K, and NANDing results D2_1 through D2_K are NANDed again by NAND gate NAND2_0, by which a value of the final output signal DATA_DET2 is determined.

Figure 3:
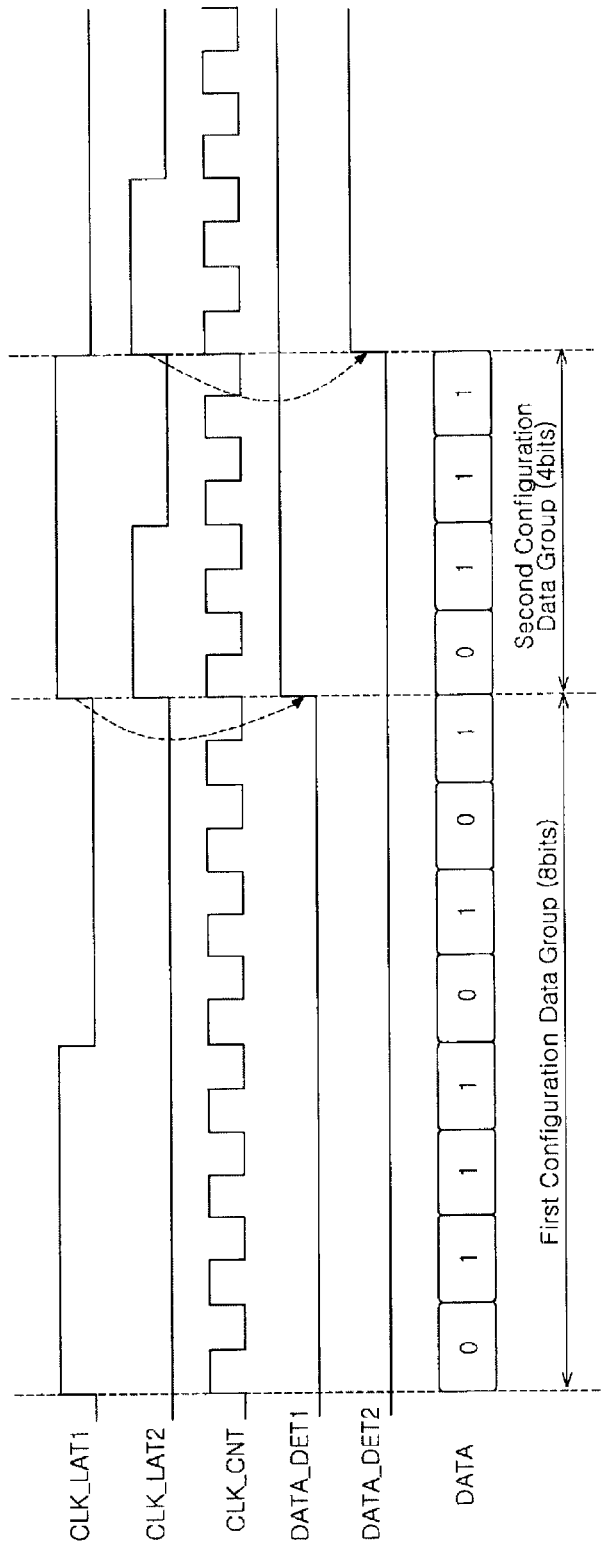
FIG. 3 is a timing diagram illustrating internal operations of the data determination section shown in FIG. 2.

FIG. 3 is a timing diagram illustrating internal operations of the data determination section 22_2 shown in FIG. 2.

The internal operations of the data determination section 22_2 will be described below with reference to the timing diagram of FIG. 3.

The first latching clock signal CLK_LAT1 is a signal which has a cycle eight times longer than the cycle of the counting clock signal CLK_CNT, and the second latching clock signal CLK_LAT2 is a signal which has a cycle four times longer than the cycle of the counting clock signal CLK_CNT.

The data determination section 22_2 latches 8-bit data corresponding to the first configuration data group, during the eight cycles of the counting clock signal CLK_CNT, determines a majority through the latched 8-bit data, and outputs a result as the final output signal DATA_DET1 under the control of the first latching clock signal CLK_LAT1.

The data determination section 22_2 latches 4-bit data corresponding to the second configuration data group, during the four cycles of the counting clock signal CLK_CNT, determines a majority through the latched 4-bit data, and outputs a result as the final output signal DATA_DET2 under the control of the second latching clock signal CLK_LAT2.

As can be seen from the above description, a method for in processing configuration information of a nonvolatile memory apparatus, suitable for generating configuration data groups by copying values of input data signals by a predetermined number of bits, includes the steps of generating a configuration data group with a bit number when the input data signals correspond to second configuration information, that is fewer than that when the input data signals correspond to first configuration information; programming the configuration data group generated in the step of generating the configuration data group, to a memory device; and detecting to which of the first configuration information and the second configuration information the configuration data group outputted from the memory device corresponds, and determine a majority by controlling a determining bit number depending upon a detection result.

The first configuration information includes internal bias information and internal logic configuration information, and the second configuration information includes failed address information and redundancy information. The step of determining the majority is implemented by determining a majority of a first configuration data group corresponding to the first configuration information during a first period as an initial stage of a power-up operation, and by determining a majority of a second configuration data group corresponding to the second configuration information during a second period after the first period.

Therefore, the nonvolatile memory apparatus and the method for processing configuration information of a nonvolatile memory apparatus according to the embodiments of the present invention provide advantages in that a configuration information processing time can be shortened.

So far, embodiments of the present invention have been described in detail. For reference, embodiments including additional component elements, which are not directly associated with the technical spirit of the present invention, may be exemplified in order to describe the present invention in further detail. Moreover, an active high configuration or an active low configuration for indicating the activated states of signals and circuits may vary depending upon an embodiment. Since such embodiment changes have a large number of cases and can be easily inferred by those skilled in the art, the enumeration thereof will be omitted herein.

While certain embodiments have been described above, it will be understood to those skilled in the art that the embodiments described are by way of example only. Accordingly, the nonvolatile memory apparatus and the method for processing configuration information thereof described herein should not be limited based on the described embodiments. Rather, the nonvolatile memory apparatus and the method for processing configuration information thereof described herein should only be limited in light of the claims that follow when taken in conjunction with the above description and accompanying drawings.

What is claimed is:

1. A nonvolatile memory apparatus comprising:
   a memory device having a configuration information storage block for storing a first configuration data group and a second configuration data group having fewer bits than the first configuration data group; and
   a configuration information processing circuit configured to determine a majority of the first configuration data group received from the memory device, during a first period of a power-up operation, and determine a majority of the second configuration data group received from the memory device, during a second period after the first period,
   wherein the configuration information processing circuit comprises a control clock output unit configured to output a counting clock signal and a first latching clock signal when a first period signal is activated, and output the counting clock signal and a second latching clock signal with a cycle shorter than that of the first latching clock signal when a second period signal is activated; and a configuration data processing unit configured to determine the majorities of the first and second configuration data groups which are sequentially received from the memory device, under the control of the counting clock signal and corresponding latching clock signals received from the control clock output unit.

2. The nonvolatile memory apparatus according to claim 1, wherein the configuration information storage block is divided into a plurality of pages, and each page comprises a plurality of nonvolatile memory cells.

3. The nonvolatile memory apparatus according to claim 1, wherein the first configuration data group includes internal bias information and internal logic configuration information, and the second configuration data group includes failed address information and redundancy information.

4. The nonvolatile memory apparatus according to claim 1, wherein the memory device comprises:
   main storage blocks; and
   a page buffer configured to detect and output data stored in the configuration information storage block and the main storage blocks.

5. The nonvolatile memory apparatus according to claim 4, wherein each of the main storage blocks is divided into a plurality of pages, and each page includes a plurality of nonvolatile memory cells.

6. The nonvolatile memory apparatus according to claim 1, wherein the first and second latching clock signals each have cycles that are longer by a respective predetermined number of times than the counting clock signal.

7. The nonvolatile memory apparatus according to claim 1, wherein the first period signal is a signal which is activated during the first period, and the second period signal is a signal which is activated during the second period.

8. The nonvolatile memory apparatus according to claim 1, wherein the control clock output unit comprises:
   an oscillator configured to generate a reference clock signal in response to a clock enable signal; and
   a clock dividing section configured to generate the counting clock signal, the first latching clock signal, and the second latching clock signal by dividing the reference clock signal, and output the first latching clock signal and the second latching clock signal in response to the first period signal and the second period signal, respectively.

9. The nonvolatile memory apparatus according to claim 1, wherein the configuration data processing unit determines the majority of the first configuration data group under the control of the counting clock signal and the first latching clock signal, and determines the majority of the second configuration data group under the control of the counting clock signal and the second latching clock signal.

10. The nonvolatile memory apparatus according to claim 1, wherein the configuration data processing unit comprises:
    a data multiplexing section configured to perform a function of parallel-to-serial conversion of the configuration data groups;
    a data determination section configured to determine majorities of signals which are outputted from the data multiplexing section, under the control of the counting clock signal and the corresponding latching clock signals, and output determination results; and
    a latch section configured to latch the determination results.

11. The nonvolatile memory apparatus according to claim 10, wherein the data determination section comprises:
    a plurality of serially coupled D flip-flops configured to latch a plurality of data signals which are sequentially applied, under the control of the counting clock signal; and
    a first data combining part configured to process the plurality of data signals stored in the plurality of D flip-flops, detect a majority, and output a first detected signal under the control of the first latching clock signal; and
    a second data combining part configured to process the plurality of data signals stored in the plurality of D flip-flops, detect a majority, and output a second detected signal under the control of the second latching clock signal.

\* \* \* \* \*